US006575688B2

(12) United States Patent
Mehdianpour

(10) Patent No.: US 6,575,688 B2
(45) Date of Patent: Jun. 10, 2003

(54) PLACEMENT HEAD AND PLACEMENT SYSTEM FOR A PLACEMENT APPARATUS FOR PLACING COMPONENTS

(75) Inventor: Mohammad Mehdianpour, Munich (DE)

(73) Assignee: Siemens Dematic AG, Nürnberg (DE)

( * ) Notice: Subject to any disclaimer, the term of this patent is extended or adjusted under 35 U.S.C. 154(b) by 0 days.

(21) Appl. No.: 09/912,260

(22) Filed: Jul. 25, 2001

(65) Prior Publication Data

US 2002/0079712 A1 Jun. 27, 2002

(30) Foreign Application Priority Data

Dec. 21, 2000 (DE) ............................... 100 64 108

(51) Int. Cl.[7] ............................................. H05K 3/30
(52) U.S. Cl. ................................... 414/226.01; 29/740
(58) Field of Search ........................ 294/87.1, 86.4; 414/226.01, 736; 901/8; 29/739–741, 749, 792; 483/14, 15, 901, 902

(56) References Cited

U.S. PATENT DOCUMENTS

| 4,571,813 A | * | 2/1986 | Fukuoka et al. | ............. | 414/736 |
|---|---|---|---|---|---|
| 4,655,676 A | * | 4/1987 | Jannborg et al. | ............... | 29/792 |
| 4,930,976 A | * | 6/1990 | Spacher et al. | ................ | 29/741 |
| 5,040,291 A | * | 8/1991 | Janisiewicz et al. | ........... | 29/740 |
| 5,425,132 A | * | 6/1995 | Nakamura | .................... | 700/245 |
| 5,778,525 A | * | 7/1998 | Hata et al. | ..................... | 29/714 |
| 5,862,586 A | | 1/1999 | Kimura | | |
| 5,957,305 A | * | 9/1999 | Takahashi | .................... | 209/573 |
| 5,974,643 A | * | 11/1999 | Hays et al. | ..................... | 29/39 |

FOREIGN PATENT DOCUMENTS

DE 196 54 172 A1 7/1997

* cited by examiner

Primary Examiner—Dean J. Kramer
(74) Attorney, Agent, or Firm—Staas & Halsey LLP

(57) ABSTRACT

Placement head and placement system for a placement apparatus for placing components in a placement plane, at least one placement head being provided with at least one gripper for picking up and/or putting down the components. The gripper is fitted in an edge region of the placement head, with the result that, in the case of a projection of the placement head onto the placement plane, the image of the gripper situated in the placement position essentially does not project from the image of the placement head. According to the invention, simultaneous independent placement using a plurality of placement heads is possible without the risk of a collision of the placement heads.

7 Claims, 2 Drawing Sheets

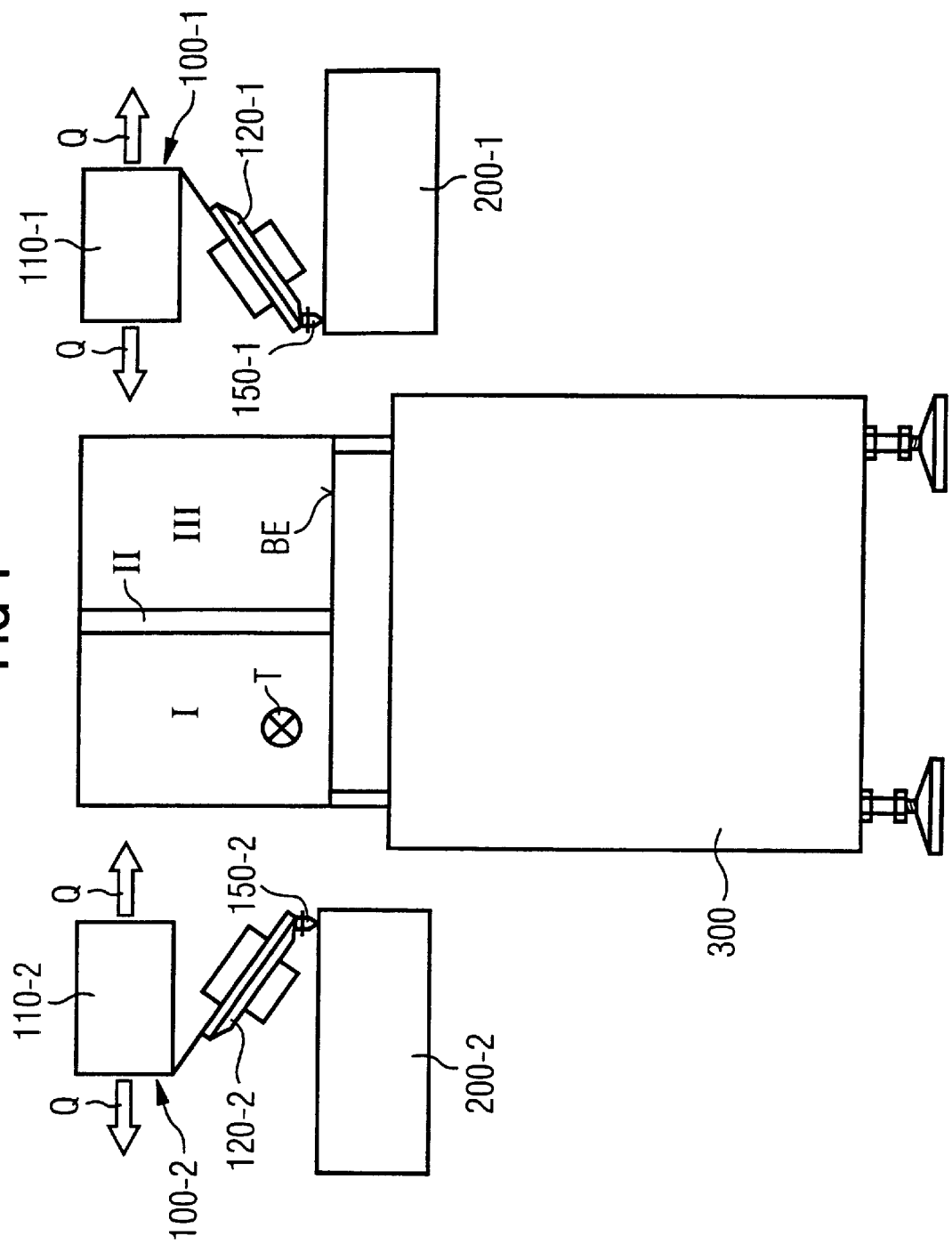

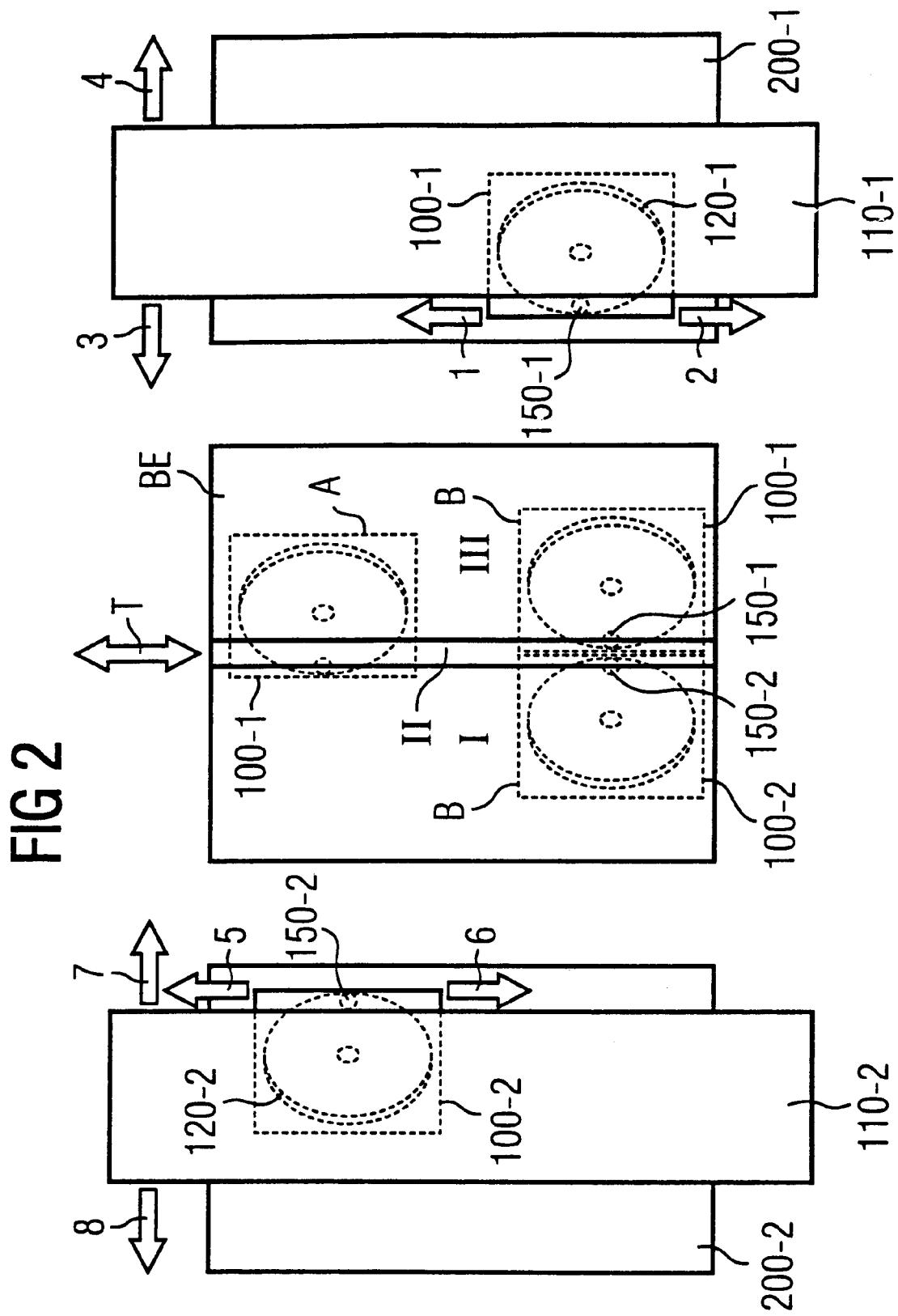

PLACEMENT HEAD AND PLACEMENT SYSTEM FOR A PLACEMENT APPARATUS FOR PLACING COMPONENTS

CROSS REFERENCE TO RELATED APPLICATIONS

This application is based on and hereby claims priority to German Application No. 10064108.3 filed on Dec. 21, 2000 in Germany, the contents of which are hereby incorporated by reference.

BACKGROUND OF THE INVENTION

The invention relates to a placement head and also a placement system for a placement apparatus for placing components in a placement plane, which has at least one gripper for picking up and/or putting down the components.

In conventional automatic placement machines having a plurality of placement heads which each populate a placement plane with components from different sides of the placement plane, there is a problem in that the placement heads cannot simultaneously populate the placement plane. This results in a risk of collision of placement heads simultaneously effecting placement, which exists whenever the placement heads have mutually overlapping movement regions. An attempt has previously been made to solve this problem by the placement heads only being used one after the other to populate the placement plane. In this case, by way of example, the placement plane is populated by one placement head, while components are picked up from a feed device by another placement head. In this case, however, the placement performance of the automatic placement machine essentially depends on the placement performance of a single placement head and is thus greatly limited.

SUMMARY OF THE INVENTION

One potential application of the invention is based on the object of specifying a placement head and also a placement system by which faster, more flexible and more reliable placement is possible.

One aspect of the invention provides a placement head for a placement apparatus for placing components in a placement plane, which has at least one gripper for picking up and/or for puffing down the components in a placement position of the placement head. In this case, the placement position is that position of the placement head in which the gripper is able to pick up or put down a component. The gripper is fitted in an edge region of the placement head in such a way that, in the case of a projection of the placement head onto the placement plane, the image of the gripper situated in the placement position essentially does not project from the image of the placement head. This ensures that the gripper situated in the placement position is arranged near the edge region of the placement head and the gripper, in the direction in which the placement head can move toward a lateral boundary of the placement plane, does not substantially project beyond the placement head. As a result, the placement plane can be populated essentially over the whole area with the placement head.

In the case of a placement head having a plurality of grippers, the latter are fitted on the placement head, for example in a rotationally symmetrical manner, and their axis of rotation is inclined with respect to the placement plane of the automatic placement machine. The effect achieved by the inclination of the axis of rotation is that the structural space required for mounting a corresponding rotationally symmetrical holder for the grippers above the placement plane does not have to extend in the direction perpendicular to the placement plane beyond the limits of the rotationally symmetrical holder. The grippers can then be arranged, with respect to the rotationally symmetrical holder, with the same angle of inclination which the axis of rotation forms with the placement plane of the automatic placement machine, with the result that a gripper situated in the placement position is arranged perpendicular to the placement plane. This makes it possible to minimize the structural space of the placement head that is required in the vertical direction above the placement plane.

The placement head can also be designed like a turret head. In this case, the rotationally symmetrical holder for the grippers has a turret form. The axis of rotation of this turret may in this case be inclined or perpendicular with respect to the placement plane of the automatic placement machine.

One aspect of the invention also provides a placement system having at least two elongate supports, by which a respective placement head is guided movably in a respective first movement region. In this case, the supports are arranged facing one another above the placement plane. The configuration of the placement heads makes it possible for the latter to be moved simultaneously within the respective first movement region, with the result that the placement plane can be simultaneously populated in the first movement regions by the placement heads. Since the placement heads are designed in such a way that the grippers, in the placement position of the respective placement head, are arranged directly in the edge region of the placement head and essentially such that they do not project from said placement head, a plurality of placement heads can be moved toward one another in such a way that they cannot touch one another within their first movement region, but the remaining movement region above the placement plane, which region is not covered by the respective first movement regions, is very small. In particular, except for a second movement region whose width essentially corresponds to the diameter of a gripper, the placement heads can populate the placement plane simultaneously and independently of one another. The second movement region whose width essentially corresponds to the diameter of a gripper must be sequentially populated by the placement heads in order to rule out possible collisions between the placement heads.

A placement head and also a placement system which is provided, with the placement head in which a gripper is fitted in an edge region of the placement head, so that it terminates for example flush with the edge region of the placement head or projects only slightly from this edge region beyond the placement head.

Using such a placement head or placement system, in a placement plane of an automatic placement machine on which there are boundary areas that are vertical with respect to the placement plane, the entire placement plane can be populated except for a residual region whose width corresponds to half the diameter of a gripper of the placement head. In this case, the residual region is the region yielded on the placement plane between the vertical boundary area directly adjoining the placement plane and the region which can be populated by the placement head.

If a plurality of placement heads are used in a placement system, then a vertical boundary area is defined for example in the limits of the movement region of one of the two placement heads. The respective other placement head must not exceed the limits of this movement region since otherwise there is a risk of collision with the other placement head. Since the grippers are arranged on the placement heads in a respective edge region of the placement head in a manner terminating with the latter or projecting slightly from said edge region, that movement region which, in the case of simultaneous and independent operation of the two placement heads, cannot be used, in order to avoid collisions, corresponds to a movement region whose width essentially corresponds to the diameter of a gripper. This second movement region can only be sequentially populated by the placement heads.

By virtue of the simultaneous placement using, for example, two or more placement heads, the oscillations in the placement system are minimized since it is possible to carry out simultaneously mutually corresponding movements in opposite directions. If a plurality of printed circuit boards are arranged next to one another on the placement plane, it is possible to effect placement simultaneously and independently without limitations, since the second movement region, in which the placement heads should operate sequentially, for example in the case of two printed circuit boards arranged next to one another, is covered by the transport mechanism between the printed circuit boards, which is not populated.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 shows a diagrammatic side view of a preferred embodiment according to the invention, and FIG. 2 shows a diagrammatic plan view of the preferred embodiment according to the invention.

DETAILED DESCRIPTION OF THE PREFERRED EMBODIMENT

A diagrammatic side view of an embodiment can be seen from FIG. 1. A placement plane BE is situated on a base 300. The placement plane BE may be, for example, the surface of printed circuit boards which are intended to be populated. These printed circuit boards can be transported over the base 300 by a transport mechanism, for example. In this case, the width of the printed circuit boards may be dimensioned in such a way that the width of one printed circuit board corresponds to the width of the placement plane BE, or a plurality of printed circuit boards can be transported next to one another over the base 300 by independent transport mechanisms.

Two first movement regions I and III and also a second movement region II can be seen above the placement plane BE. Respective placement heads 100-1 and 100-2 arranged on supports 110-1 and 110-2, respectively, are shown to the sides of the placement plane. In each case, the head is provided with a rotationally symmetrical holder 120-1 and 120-2, respectively, for accommodating a gripper 150-1 or 150-2, respectively.

The placement heads 100-1 and 100-2, respectively, can in this case be moved on the supports 110-1 and 110-2, respectively, in the transport direction T of the transport mechanisms (not shown) above the placement plane. Moreover, the supports 110-1 and 110-2, respectively, can be moved in the transverse direction with respect to the transport direction T above the placement plane, as indicated by the arrows Q in FIG. 1.

The grippers 150-1 and 150-2, respectively, are arranged on the rotationally symmetrical holders 120-1 and 120-2, respectively, in such a way that, in a placement position in which the grippers 150-1 and 150-2, respectively, can pick up a placement element from a diagrammatically shown feed devices 200-1 and 200-2, respectively, or can put down a picked-up component on the placement plane BE, the grippers 150-1 and 150-2, respectively, does not protrude, or does not substantially protrude, transversely with respect to the transport direction T toward the respective other placement head 100-2 or 100-1. Furthermore, in the first movement regions, the placement heads 100-1 and 100-2 can be moved toward one another only to the extent that they cannot touch one another.

As a result, it is possible, in the respective first movement regions I and III of the placement heads 100-1 and 100-2, respectively, to effect placement simultaneously and independently of one another, since a second movement region II remains between the two first movement regions I and III, none of the placement heads 100-1 and 100-2, respectively, exceeding the limits of said second movement region to the extent that a collision of the placement heads 100-1 and 100-2 can occur.

Consequently, in the movement regions I and II, the placement heads 100-1 and 100-2, respectively, can effect placement independently of one another and simultaneously, without the risk of a collision of the placement heads 100-1 and 100-2.

A diagrammatic plan view of the embodiment can be seen from FIG. 2. In addition, the placement heads 100-1 and 100-2, respectively, are in each case shown in projection onto the placement plane at two positions A and B. The placement heads 100-1 and 100-2 can be moved along the supports 110-1 and 110-2, respectively, in the transport direction T of the printed circuit boards (not shown) above the placement plane, as denoted by the arrows 1 and 2, and respectively 5 and 6. Moreover, the placement heads 100-1 and 100-2, respectively, can be moved transversely with respect to the transport direction T, as denoted by the arrows 3 and 4, and respectively 7 and 8. For the placement heads 100-1 and 100-2, this results in freedom of movement in two dimensions parallel to the placement plane BE.

Three movement regions I, II and III of the placement heads are depicted above the placement plane BE. The movement regions I and III correspond to the movement regions in which the placement heads 100-1 and 100-2, respectively, can be moved simultaneously and independently of one another and can thus effect placement simultaneously and independently of one another. This can be seen diagrammatically from the projection of the placement heads 100-1 and 1002 in the position B in FIG. 2. In the course of simultaneous and independent placement, the placement heads 100-1 and 100-2 are moved toward one another transversely with respect to the placement plane BE only to such an extent that a small minimum spacing still remains between the grippers 150-1 and 150-2 of the two placement heads 100-1 and 100-2, respectively, said grippers facing one another in the transverse direction with respect to the transport direction T.

Moreover, a projection of the placement head 100-1 is also shown by way of example in a position A, in which the placement head 100-1 can place a component in the second movement region II of the placement plane BE. However, placement within the second movement region II using a plurality of placement heads is only possible sequentially, in order to rule out the risk of a collision of the placement heads. Therefore, according to the invention, the placement in the first movement regions I and III and the placement in the second movement region II take place temporally separately from one another. In other words, either placement can be effected simultaneously using a plurality of placement heads in the first movement regions I and III or, temporally separately from the simultaneous placement, placement can be effected using a plurality of placement heads sequentially in the second movement region II.

The invention has been described in detail with particular reference to preferred embodiments thereof and examples, but it will be understood that variations and modifications can be effected within the spirit and scope of the invention.

What is claimed is:

1. A placement system comprising:

at least two elongate supports; and a placement head positioned on each elongate support, the placement head comprising:

at least one gripper to perform at least one of picking up and putting down the components in a placement position on a placement plane, the gripper being located at an edge region of the placement head in such a way that, in the case of a projection of the placement head onto the placement plane, the image of the gripper situated in the placement position does not project substantially from the image of the placement head, each placement head being guided movably in a respective first movement region, the elongate supports facing one another above the placement plane, the placement heads being movable simultaneously up to the limit of their respective first movement region, with the result that the placement plane can be simultaneously populated in the first movement regions by the placement heads, a second movement region is provided in a manner adjoining the first movement regions of the placement heads, such that the width of second movement region essentially corresponds to the diameter of a gripper, and in the second movement region the placement plane can be sequentially populated by the placement heads.

2. The placement system as claimed in claim 1, wherein for each elongate support, the gripper is located on the placement head substantially in a rotationally symmetrical manner and the axis of rotation of the gripper, which is arranged in a rotationally symmetrical manner, is at an inclination with respect to the placement plane.

3. The placement system as claimed in claim 2, wherein the placement head is in the form of a turret head.

4. The placement system as claimed in claim 1, wherein the placement head is in the form of a turret head.

5. The placement system as claimed in claim 1, wherein the second movement region is arranged between the first movement regions.

6. The placement system as claimed in claim 5, wherein the first movement regions, together with the second movement region cover the whole area of the placement plane.

7. The placement system as claimed in claim 1, wherein the first movement regions, together with the second movement region cover the whole area of the placement plane.

* * * * *